(12) United States Patent
Kim et al.

(10) Patent No.: US 11,158,499 B2
(45) Date of Patent: Oct. 26, 2021

(54) SEMICONDUCTOR COMPONENT AND METHOD FOR FABRICATING THE SAME

(71) Applicant: XIA TAI XIN SEMICONDUCTOR (QING DAO) LTD., Qingdao (CN)

(72) Inventors: Deok-Yong Kim, Singapore (SG); Yongchul Oh, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 16/812,589

(22) Filed: Mar. 9, 2020

(65) Prior Publication Data

US 2021/0280412 A1   Sep. 9, 2021

(51) Int. Cl.
*H01L 21/00* (2006.01)
*H01L 21/02* (2006.01)
*H01L 21/28* (2006.01)
*H01L 23/498* (2006.01)
*H01L 23/532* (2006.01)

(52) U.S. Cl.
CPC .. *H01L 21/02225* (2013.01); *H01L 21/02109* (2013.01); *H01L 21/28035* (2013.01); *H01L 21/28097* (2013.01); *H01L 23/49838* (2013.01); *H01L 23/53209* (2013.01)

(58) Field of Classification Search
None
See application file for complete search history.

(56) References Cited

U.S. PATENT DOCUMENTS

2006/0289918 A1* 12/2006 McDaniel ......... H01L 21/76897
  257/296
2018/0240705 A1*  8/2018 Chang .................. H01L 23/528

* cited by examiner

*Primary Examiner* — Reema Patel
(74) *Attorney, Agent, or Firm* — ScienBiziP, P.C.

(57) ABSTRACT

A semiconductor component includes a semiconductor substrate, a first oxide layer, an oxide, a first polysilicon layer, a first metal layer, a first mask on the first metal layer, and a bitline. The semiconductor substrate includes an array region, a periphery region and a boundary open region. The boundary open region isolates the array region from the periphery region. The first oxide layer is deposited on the array region. The first polysilicon layer is deposited on the periphery region. The first metal layer is deposited on the first polysilicon layer. A trench is formed on the array region and passes through the first oxide layer. The bitline includes a second polysilicon layer filling in the trench and a second metal layer on the second polysilicon layer. A second mask is formed on the second metal layer. The second polysilicon layer is flush with the first oxide layer.

12 Claims, 18 Drawing Sheets

SEMICONDUCTOR COMPONENT AND METHOD FOR FABRICATING THE SAME

FIELD

The subject matter herein generally relates to a semiconductor, and more particularly to a semiconductor component and a method for fabricating the semiconductor component.

BACKGROUND

Semiconductor components are widely used. The preparation of semiconductor components is carried out on a basic silicon wafer substrate. After a series of selective etching and thin film deposition, a very small structure is formed on the wafer to implement the circuit design function.

With the miniaturization of the structure of semiconductor components, the degree of integration becomes higher, resulting in the parasitic capacitance of the semiconductor components becoming larger. It is necessary to provide a manufacturing process to solve the above problems.

BRIEF DESCRIPTION OF THE DRAWINGS

Implementations of the present disclosure will now be described, by way of embodiments, with reference to the attached figures.

DETAILED DESCRIPTION

Figure 1:
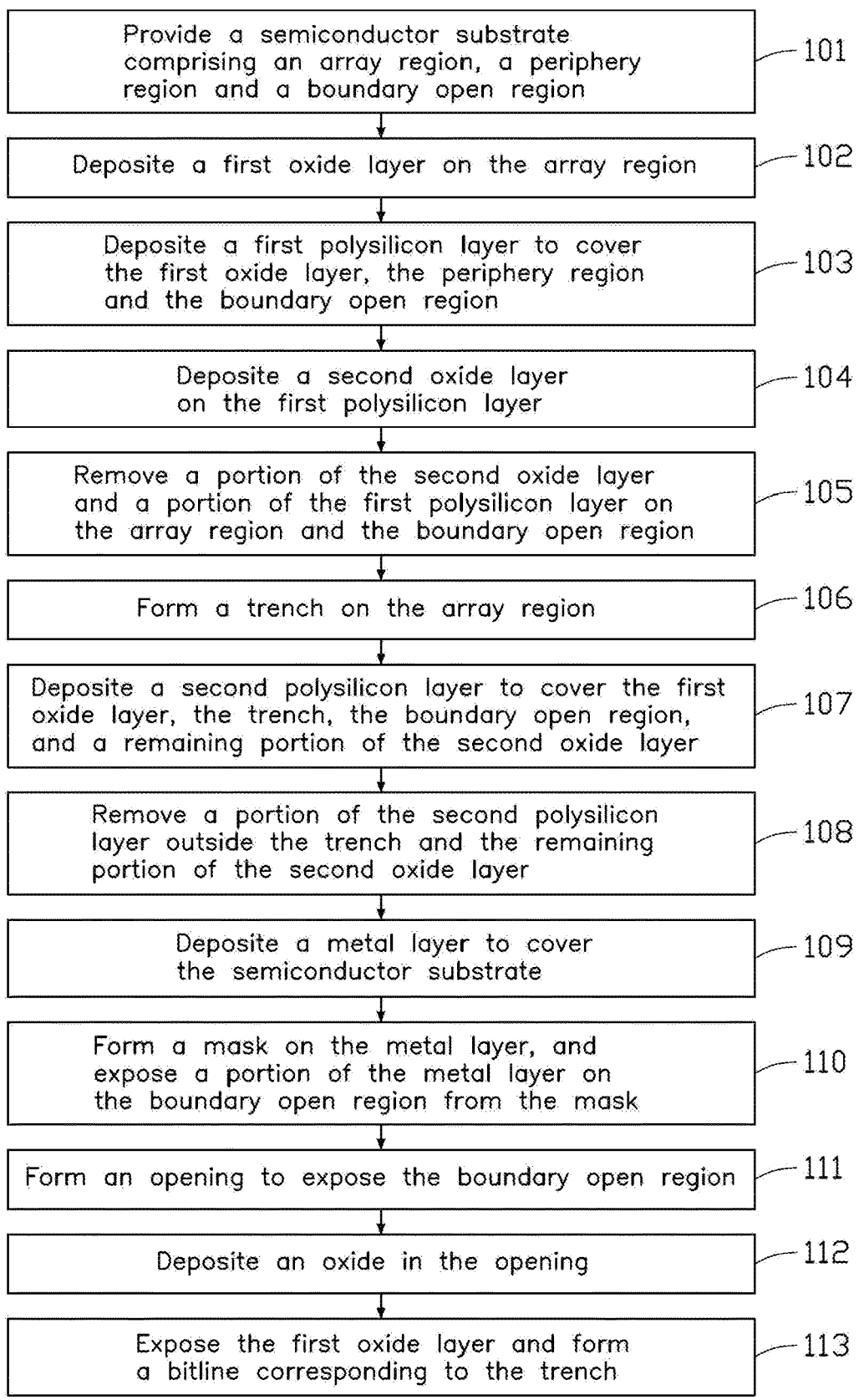
FIG. 1 is a flowchart of an embodiment of a method for fabricating the semiconductor component.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates a flowchart of a method in accordance with an embodiment. The method for fabricating the semiconductor component (shown in FIG. 14) is provided by way of embodiments, as there are a variety of ways to carry out the method. Each block shown in FIG. 1 represents one or more processes, methods, or subroutines carried out in the method. Furthermore, the order of the blocks can be changed. Additional blocks may be added or fewer blocks may be utilized, without departing from this disclosure. The method can begin at block 101.

Figure 2:
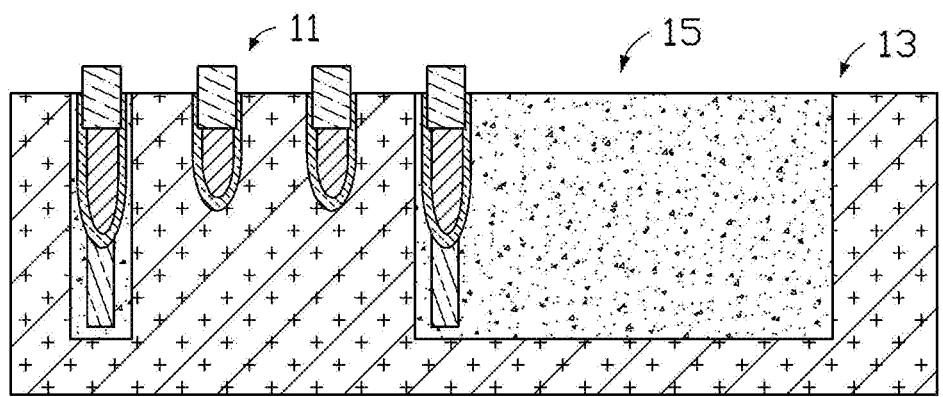
FIG. 2 is a cross-sectional view of an embodiment of semiconductor substrate.

At block 101, referring to FIG. 2, a semiconductor substrate 10 is provided. The semiconductor substrate 10 includes an array region 11, a periphery region 13 and a boundary open region 15. The boundary open region 15 isolates the array region 11 from the periphery region 13.

Figure 3:
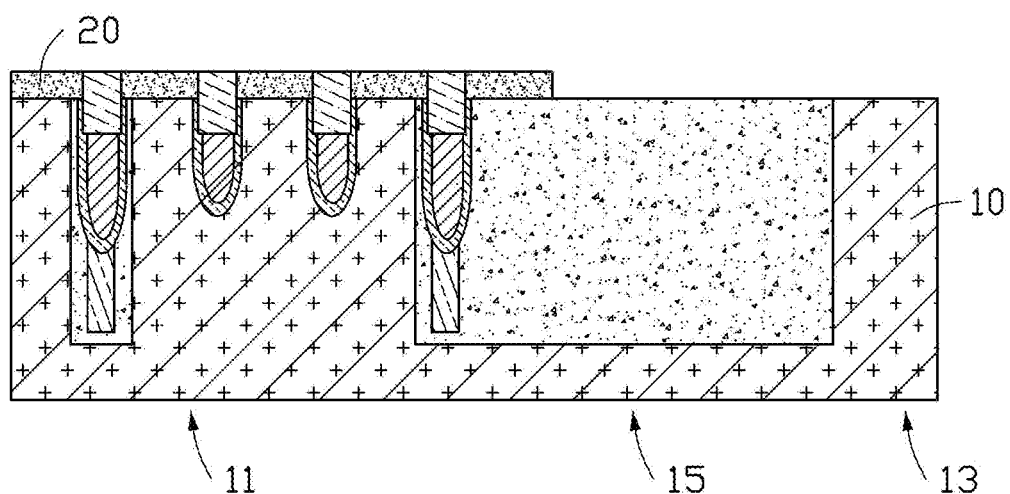
FIG. 3 is a cross-sectional view showing a first oxide layer on the semiconductor substrate of FIG. 2.

At block 102, referring to FIG. 3, a first oxide layer 20 is deposited on the array region 11.

Figure 4:
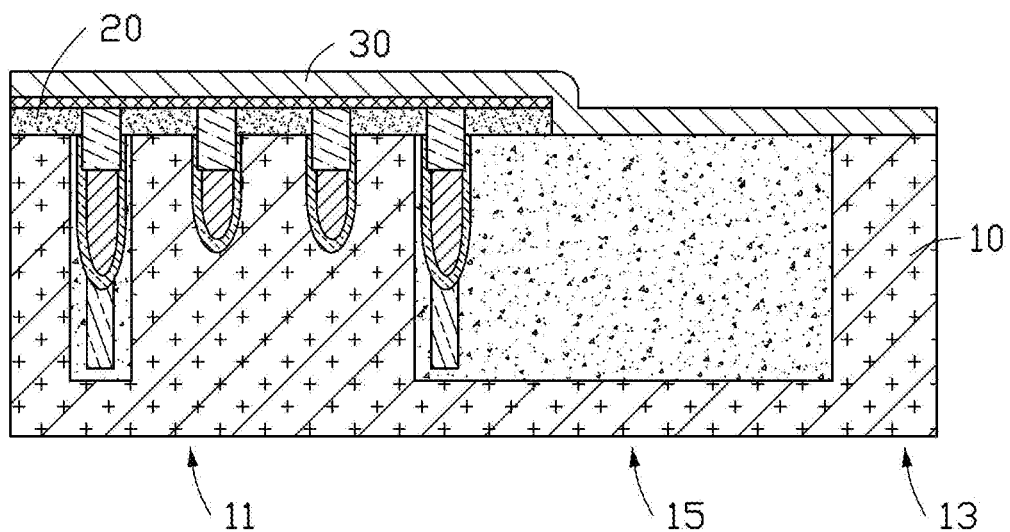
FIG. 4 is a cross-sectional view showing a first polysilicon layer on the semiconductor substrate of FIG. 3.

At block 103, referring to FIG. 4, a first polysilicon layer 30 is deposited to cover the first oxide layer 20, the boundary open region 15 and the periphery region 13.

In at least one embodiment, a surface of a portion of the first polysilicon layer 30 on the periphery region 13 facing away from the semiconductor substrate 10 is flush with a surface of the first oxide layer 20 facing away from the semiconductor substrate 10.

Figure 5:
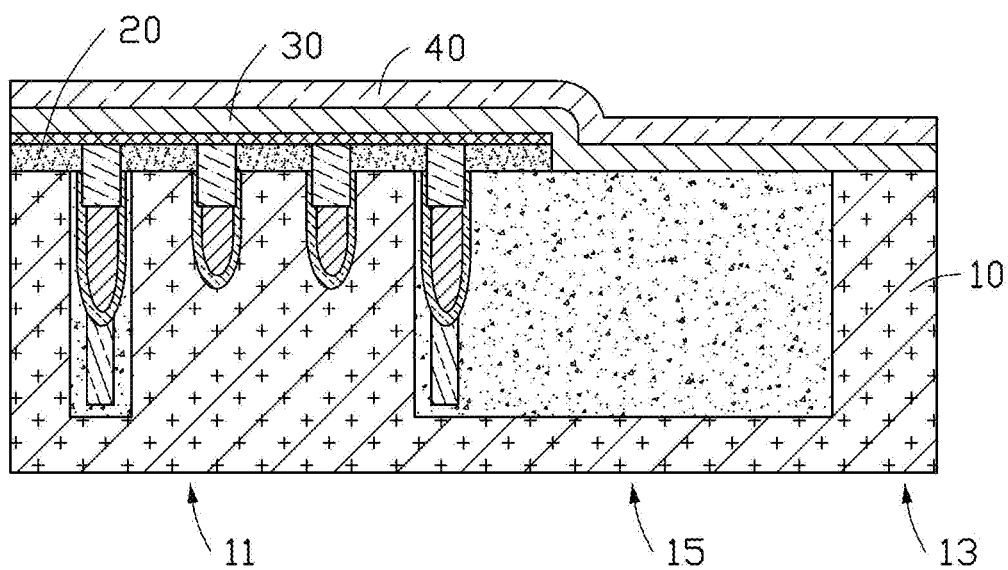
FIG. 5 is a cross-sectional view showing a second oxide layer on the first polysilicon layer of FIG. 4.

At block 104, referring to FIG. 5, a second oxide layer 40 is deposited on the first polysilicon layer 30.

Figure 6:
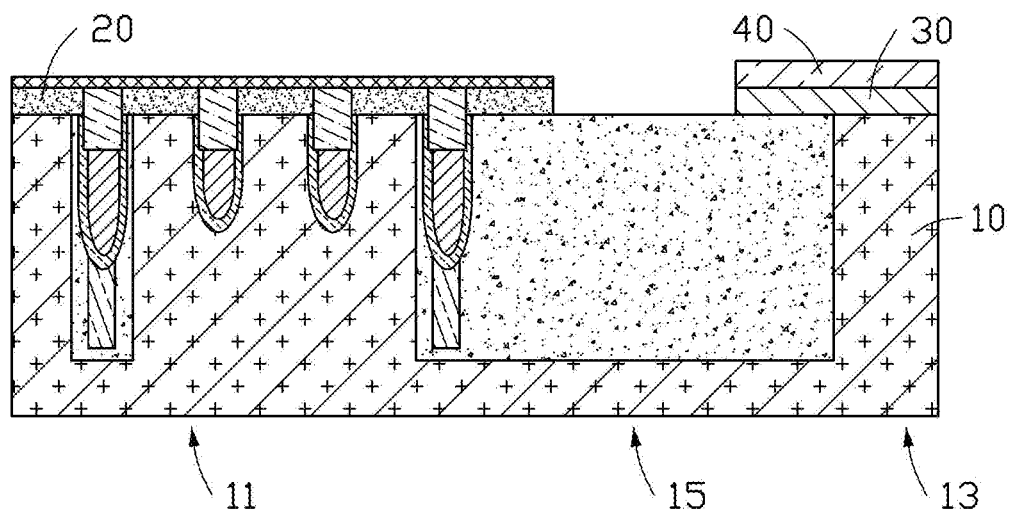
FIG. 6 is a cross-sectional view showing a portion of the second oxide layer and a portion of the first polysilicon layer removed from the semiconductor substrate of FIG. 5.

At block 105, referring to FIG. 6, a portion of the second oxide layer 40 on the array region 11 and the boundary open region 15 is removed, and a portion of the first polysilicon layer 30 on the array region 11 and the boundary open region 15 is removed.

In at least one embodiment, the portion of the second oxide layer 40 on the array region 11 and the boundary open region 15 and the portion of the first polysilicon layer 30 on the array region 11 and the boundary open region 15 is removed by dry etching.

Figure 7:
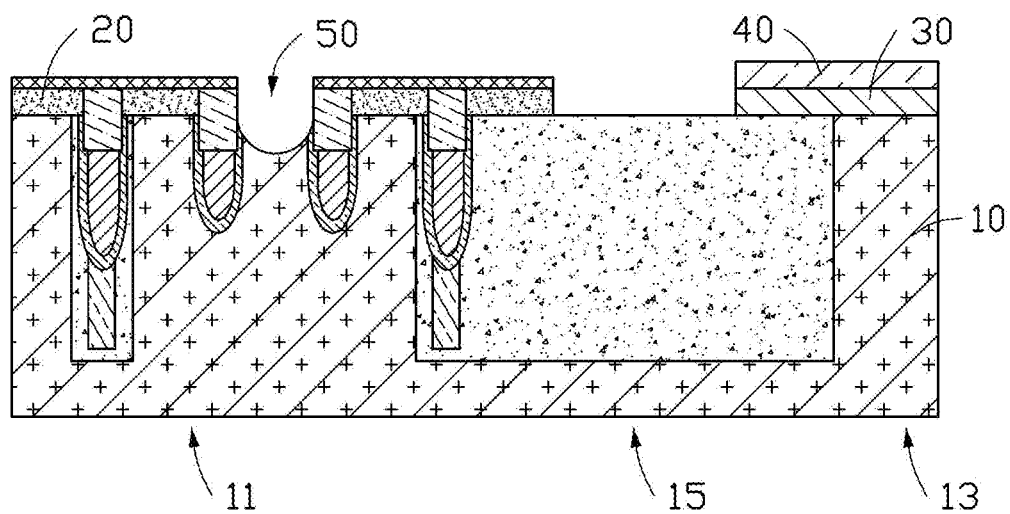
FIG. 7 is a cross-sectional view showing a trench on the semiconductor substrate of FIG. 6.

At block 106, referring to FIG. 7, a trench 50 is formed on the array region 11, and passes through the first oxide layer 20.

In at least one embodiment, the trench 50 may be formed by etching. In another embodiment, the trench 50 may be formed by other ways, such as mechanical cutting.

Figure 8:
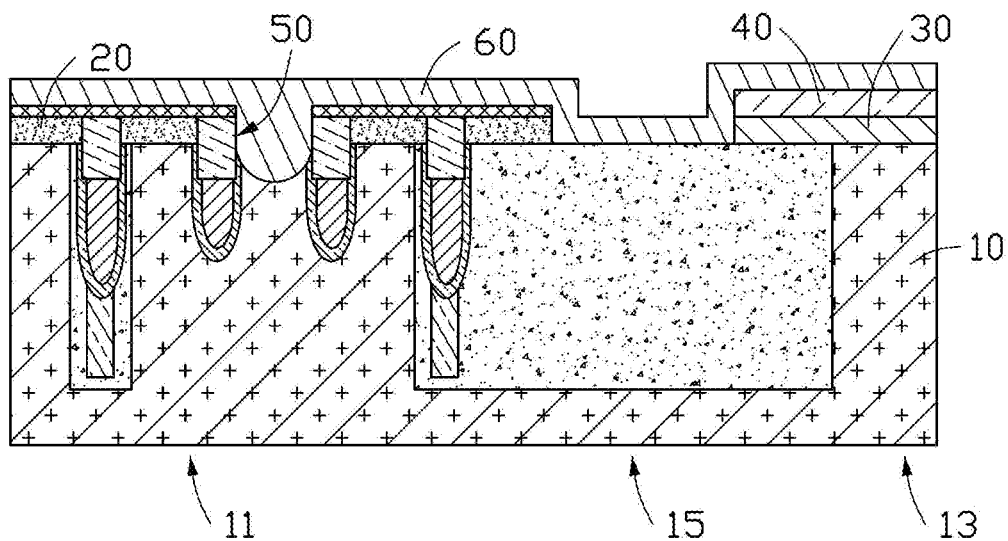
FIG. 8 is a cross-sectional view showing a second polysilicon layer on the semiconductor substrate of FIG. 7.

At block 107, referring to FIG. 8, a second polysilicon layer 60 is deposited to cover the first oxide layer 20, the trench 50, the boundary open region 15, and a remaining portion of the second oxide layer 40 on the periphery region 13. The second polysilicon layer 60 fills the trench 50.

Figure 9:
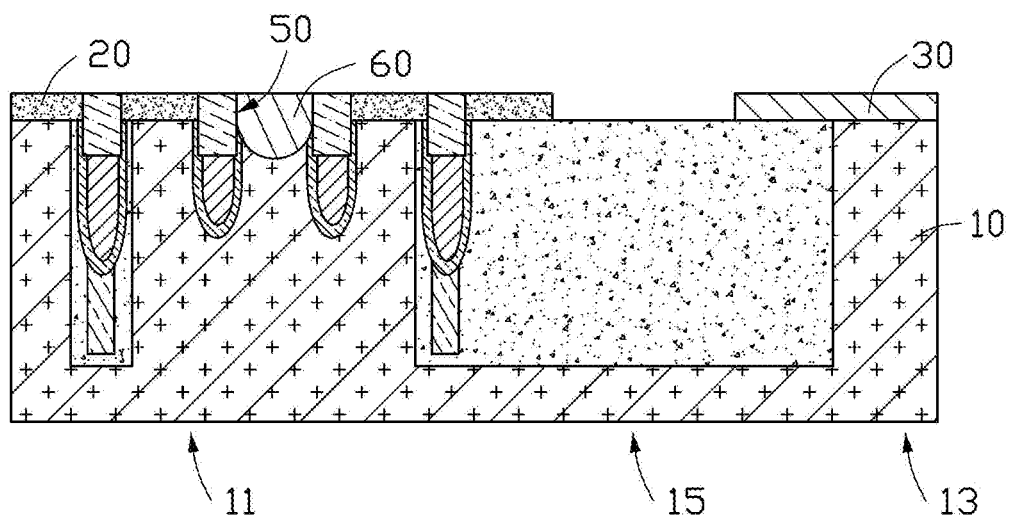
FIG. 9 is a cross-sectional view showing a portion of the second polysilicon layer and a remaining portion of the second oxide layer removed from the semiconductor substrate of FIG. 8.

At block 108, referring to FIG. 9, a portion of the second polysilicon layer 60 outside the trench 50 is removed, and the remaining portion of the second oxide layer 40 on the periphery region 13 is removed.

Figure 10:
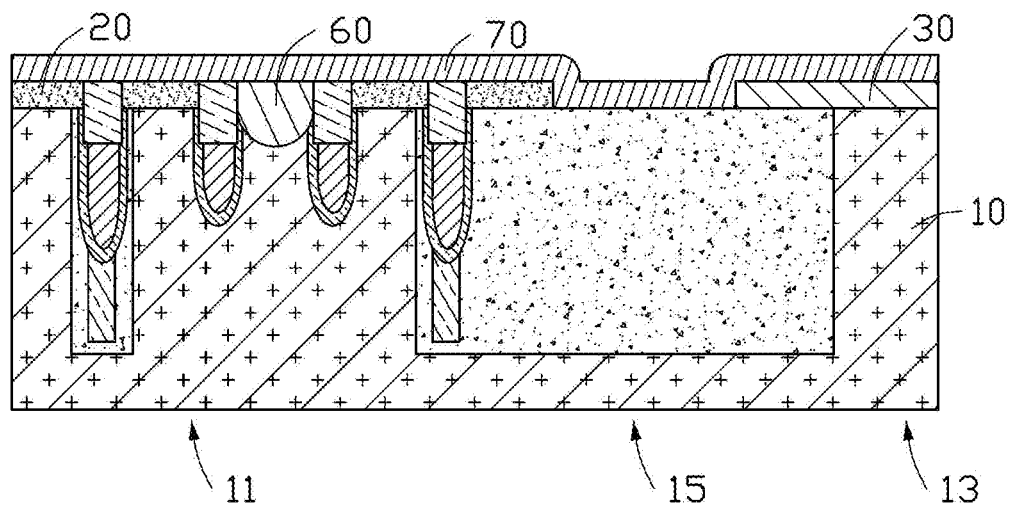
FIG. 10 is a cross-sectional view showing a metal layer on the semiconductor substrate of FIG. 9.

At block 109, referring to FIG. 10, a metal layer 70 is deposited on the first oxide layer 20, a remaining portion of the second polysilicon layer 60 in the trench 50, the boundary open region 15 and the remaining portion of the first polysilicon layer 30 on the periphery region 13.

In at least one embodiment, the metal layer 70 may be made of a material selected from tungsten, tungsten silicide, titanium, and titanium silicide.

Figure 11:
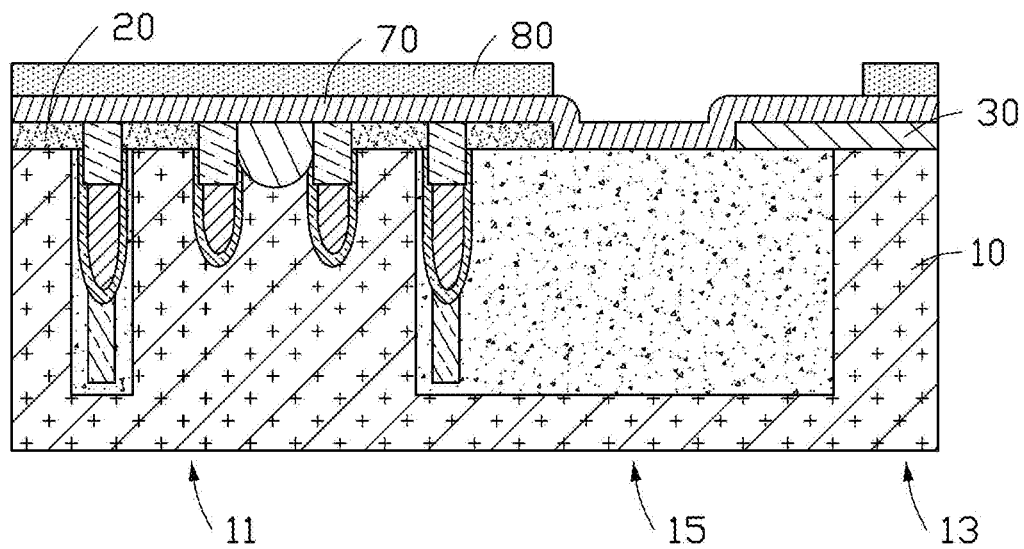
FIG. 11 is a cross-sectional view showing a mask on the metal layer of FIG. 10.

At block 110, referring to FIG. 11, a mask 80 is formed on the metal layer 70. A portion of the metal layer 70 on the boundary open region 15 is exposed from the mask 80.

In at least one embodiment, the mask 80 may be made of nitride.

Figure 12:
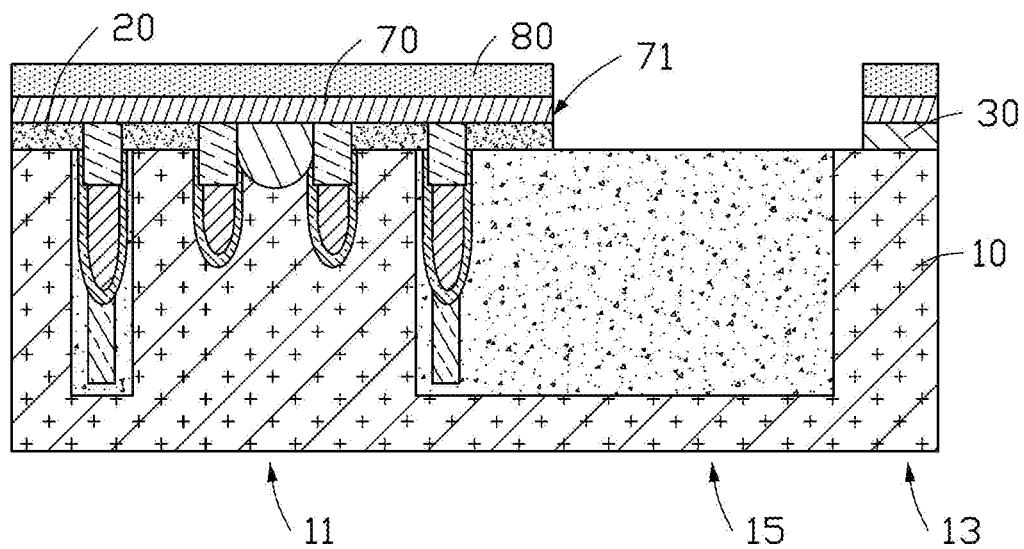
FIG. 12 is a cross-sectional view showing an opening on the metal layer of FIG. 11.

At block 111, referring to FIG. 12, an opening 71 is formed to expose to the boundary open region 15 by etching the portion of the metal layer 70 on the boundary open region 15.

Figure 13:
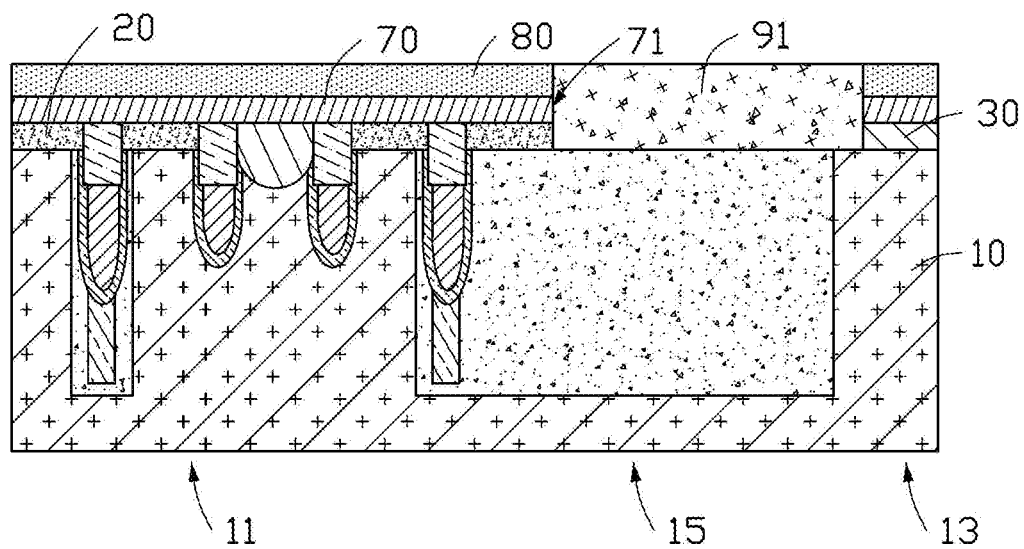
FIG. 13 is a cross-sectional view showing an oxide in the opening of FIG. 12.

At block 112, referring to FIG. 13, an oxide 91 is deposited in the opening 71.

In at least one embodiment, after depositing the oxide 91, the deposited oxide 91 may be executed a chemical mechanical polishing process for planarization.

Figure 14:
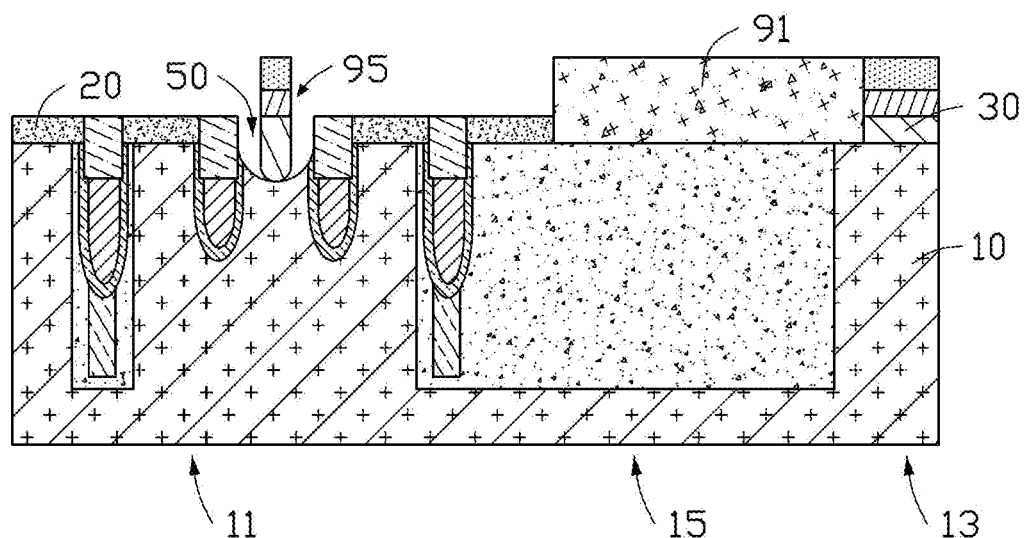
FIG. 14 is a cross-sectional view showing the first oxide layer exposed and a bitline on the semiconductor substrate of FIG. 13.

At block 113, referring to FIG. 14, the first oxide layer 20 is exposed and a bitline 95 is formed corresponding to the trench 50 by an etching process.

In at least one embodiment, a width of the bitline 95 is less than a width of the trench 50. In at least one embodiment, the bitline 95 may be separated from a side wall of the trench 50. That is, the bitline 95 may be spaced from the side wall of the trench 50.

In at least one embodiment, a surface of a portion of the mask 80 on the bitline 95 facing away from the semiconductor substrate 10 is flush with a surface of a portion of the mask 80 on the periphery region 13 facing away from the semiconductor substrate 10.

In at least one embodiment, the periphery region 13 includes source and drain portions. Boron or phosphorus may be implanted in the source and drain portions before depositing the first polysilicon layer 30.

Figure 15:
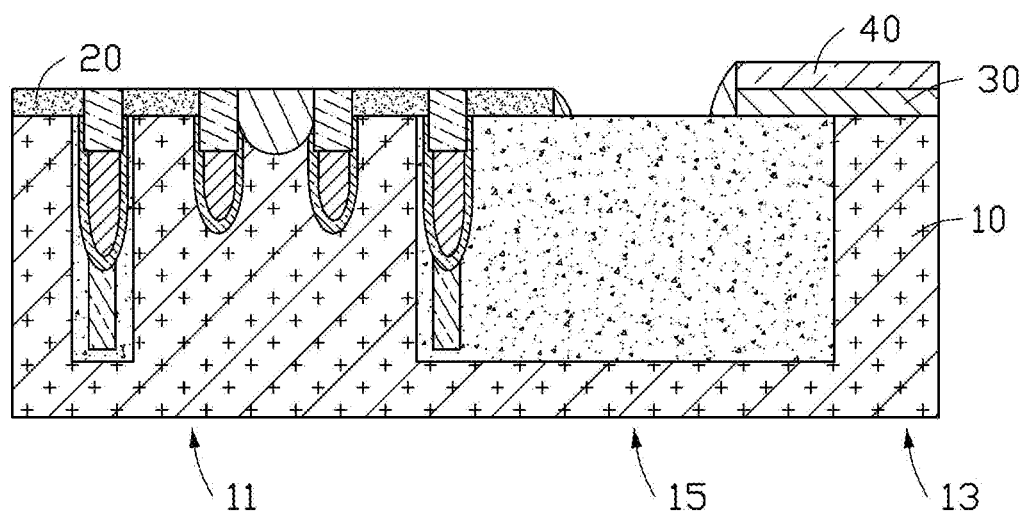
FIG. 15 is a cross-sectional view showing a portion of the second polysilicon layer removed from the semiconductor substrate of FIG. 8.

In at least one embodiment, the portion of the second polysilicon layer 60 outside the trench 50 and the remaining portion of the second oxide layer 40 on the periphery region 13 may be removed by the following steps:

Referring to FIG. 15, removing a portion of the second polysilicon layer 60 outside the trench 50 by dry etching, a portion of the second polysilicon layer 60 located a boundary of the boundary open region 15 adjacent to the array region 11 and a boundary of the boundary open region 15 adjacent to the remaining portion of the first polysilicon layer 30 on the periphery region 13 and the remaining portion of the second oxide layer 40 on the periphery region 13 may be remained.

Figure 16:
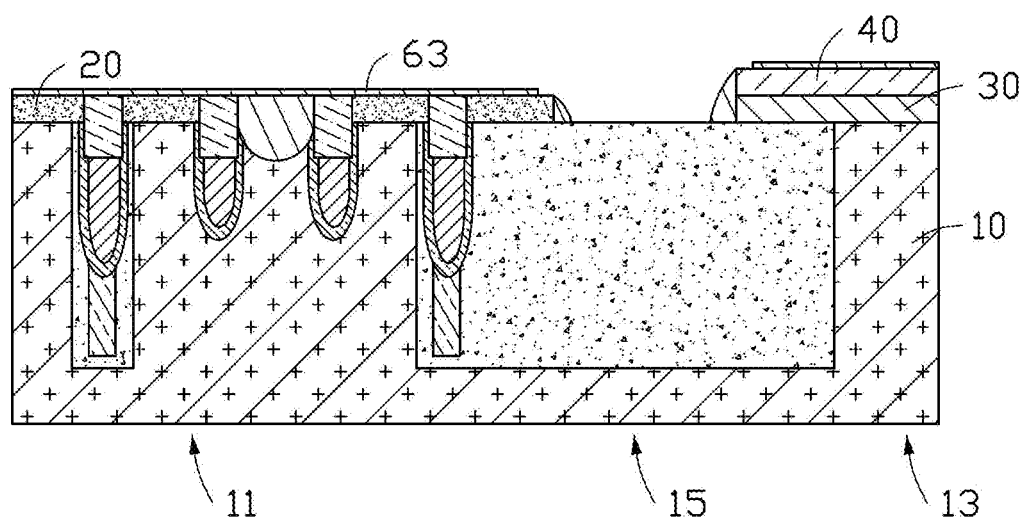
FIG. 16 is a cross-sectional view showing a photoresist layer on the semiconductor substrate of FIG. 15.

Referring to FIG. 16, forming a photoresist layer 63 on the first oxide layer 20 and the remaining portion of the second oxide layer 40 on the periphery region 13. The boundary open region 15 is exposed from the photoresist layer 63.

Figure 17:
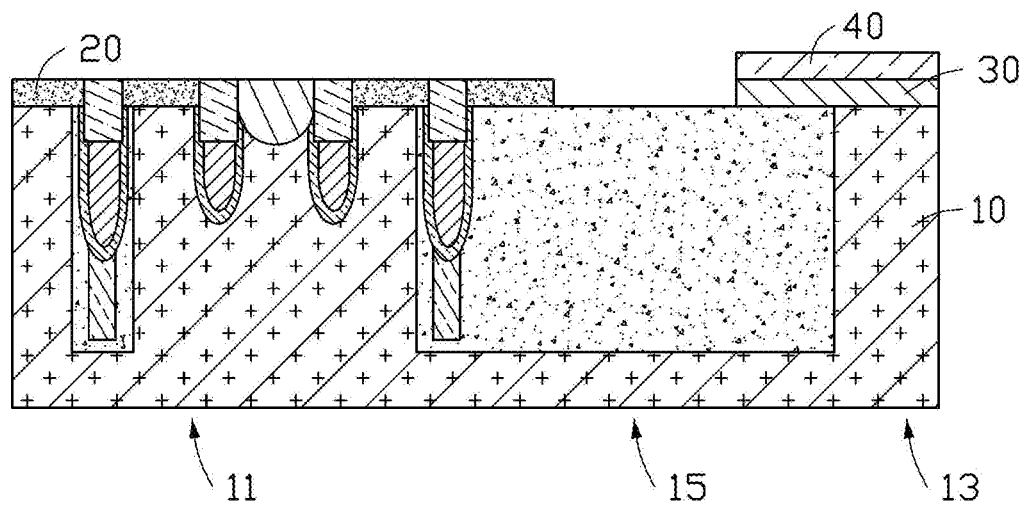
FIG. 17 is a cross-sectional view showing a remaining portion of the second polysilicon layer removed from the semiconductor substrate of FIG. 16.

Referring to FIG. 17, removing the remaining portion of the second polysilicon layer 60 on the boundary open region 15 by dry etching.

Referring to FIG. 9, removing the remaining portion of the second oxide layer 40 on the periphery region 13 by wet etching.

Depending on the embodiment, certain steps of the method described may be removed, others may be added, and the sequence of steps may be altered. It is also to be understood that the description and the claims drawn to a method may include some indication in reference to sequential steps. However, the indication used is only to be viewed for identification purposes and not as a suggestion as to an order for the steps.

Figure 18:
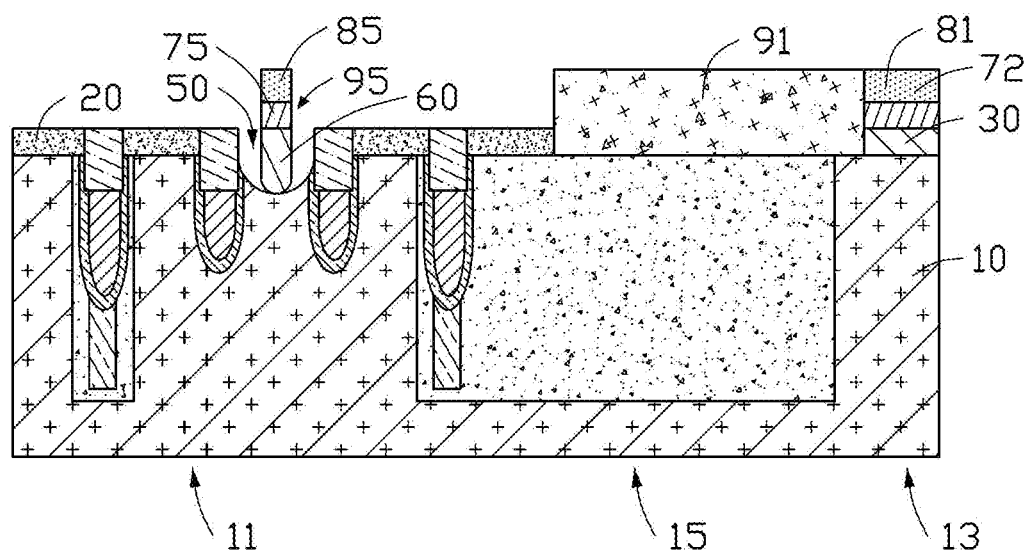
FIG. 18 is a cross-sectional view of an embodiment of a semiconductor component.

FIG. 18 illustrates an embodiment of a semiconductor component. The semiconductor component includes a semiconductor substrate 10, a first oxide layer 20, an oxide 91, a first polysilicon layer 30, a first metal layer 72, a first mask 81 on the first metal layer 72, and a bitline 95. The semiconductor substrate 10 includes an array region 11, a periphery region 13 and a boundary open region 15. The boundary open region 15 isolates the array region 11 from the periphery region 13. The first oxide layer 20 is deposited on the array region 11. The first polysilicon layer 30 is deposited on the periphery region 13. The first metal layer 72 is deposited on the first polysilicon layer 30. A trench 50 is formed on the array region 11 and passes through the first oxide layer 20. The bitline 95 includes a second polysilicon layer 60 filling in the trench 50 and a second metal layer 75 on the second polysilicon layer 60. A second mask 85 is formed on the second metal layer 75. A surface of the second polysilicon layer 60 facing away from the semiconductor substrate 10 is flush with a surface of the first oxide layer 20 facing away from the semiconductor substrate 10.

In at least one embodiment, a width of the bitline 95 is less than a width of the trench 50. In at least one embodiment, the bitline 95 may be separated from a side wall of the trench 50.

In at least one embodiment, a surface of the second mask 85 facing away from the semiconductor substrate 10 is flush with a surface of the first mask 81 facing away from the semiconductor substrate 10.

In at least one embodiment, a surface of the first polysilicon layer 30 facing away from the semiconductor substrate 10 is flush with a surface of the first oxide layer 20 facing away from the semiconductor substrate 10.

In at least one embodiment, the first metal layer 72 may be made of a material selected from tungsten, tungsten silicide, titanium, and titanium silicide.

In at least one embodiment, the second metal layer 75 may be made of a material selected from tungsten, tungsten silicide, titanium, and titanium silicide.

In at least one embodiment, each of the first mask 81 and the second mask 85 may be made of nitride.

The semiconductor component may be applied in the mobile phone, the computer or other electronic devices.

The above method for fabricating the semiconductor component may reduce a parasitic capacitance of the bitline in the semiconductor component and the volume of the semiconductor component.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for fabricating a semiconductor component comprising:
   providing a semiconductor substrate comprising an array region, a periphery region and a boundary open region isolating the array region from the periphery region;
   depositing a first oxide layer on the array region;
   depositing a first polysilicon layer on the semiconductor substrate to cover the first oxide layer, the periphery region and the boundary open region;
   depositing a second oxide layer on the first polysilicon layer;
   removing a portion of the second oxide layer on the array region and the boundary open region, and removing a portion of the first polysilicon layer on the array region and the boundary open region;
   forming a trench on the array region, wherein the trench passing through the first oxide layer;
   depositing a second polysilicon layer to cover the first oxide layer, the trench, the boundary open region, and a remaining portion of the second oxide layer on the periphery region, the second polysilicon filling the trench;
   removing a portion of the second polysilicon layer outside the trench, and removing the remaining portion of the second oxide layer on the periphery region;
   depositing a metal layer to cover the first oxide layer, a remaining portion of the second polysilicon layer in the trench, the boundary open region, and a remaining portion of the first polysilicon layer on the periphery region;
   forming a mask on the metal layer, wherein a portion of the metal layer on the boundary open region is exposed from the mask;
   forming an opening to expose the boundary open region by etching the portion of the metal layer on the boundary open region;
   depositing an oxide in the opening; and
   exposing the first oxide layer and forming a bitline corresponding to the trench by an etching process.

2. The method of claim 1, wherein a width of the bitline is less than a width of the trench.

3. The method of claim 2, wherein the bitline is separated from a side wall of the trench.

4. The method of claim 1, wherein a surface of a portion of the mask on the bitline facing away from the semiconductor substrate is flush with a surface of a portion of the mask on the periphery region facing away from the semiconductor substrate.

5. The method of claim 4, wherein a surface of the first oxide layer facing away from the semiconductor substrate is flush with a surface of the remaining portion of the first polysilicon layer facing away from the semiconductor substrate.

6. The method of claim 1, wherein a surface of the first oxide layer facing away from the semiconductor substrate is flush with a surface of the remaining portion of the first polysilicon layer facing away from the semiconductor substrate.

7. The method of claim 1, wherein a method of removing the portion of the second polysilicon layer outside the trench, and removing the remaining portion of the second oxide layer on the periphery region comprises:
   removing a portion of the second polysilicon layer outside the trench by dry etching;
   forming a photoresist layer on the first oxide layer and the remaining portion of the second oxide layer on the periphery region, wherein the boundary open region is exposed from the photoresist layer;
   removing a remaining portion of the second polysilicon layer on the boundary open region by dry etching; and
   removing the remaining portion of the second oxide layer on the periphery region by wet etching.

8. The method of claim 1, wherein the metal layer is made of a material selected from tungsten, tungsten silicide, titanium, and titanium silicide.

9. The method of claim 1, wherein the mask is made of nitride.

10. The method of claim 1, wherein after depositing the oxide in the opening and before the etching process, the method further comprises:
    executing a chemical mechanical polishing process for planarization of the deposited oxide.

11. The method of claim 1, wherein the trench is formed by etching or mechanical cutting.

12. The method of claim 1, wherein the portion of the second oxide layer on the array region and the boundary open region and the portion of the first polysilicon layer on the array region and the boundary open region are removed by dry etching.

* * * * *